(12) United States Patent
Kawanaka et al.

(10) Patent No.: US 6,403,405 B1
(45) Date of Patent: Jun. 11, 2002

(54) METHOD OF MANUFACTURING SOI ELEMENT HAVING BODY CONTACT

(75) Inventors: Shigeru Kawanaka, Kawasaki; Takashi Yamada, Ebina, both of (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/956,575

(22) Filed: Sep. 18, 2001

Related U.S. Application Data

(63) Continuation of application No. 09/032,214, filed on Feb. 27, 1998, now abandoned.

(30) Foreign Application Priority Data

Feb. 28, 1997 (JP) ................................. 9-046688

(51) Int. Cl.⁷ ................................................ H01L 21/84
(52) U.S. Cl. ...................... 438/151; 438/163; 438/294; 257/347
(58) Field of Search .................................. 438/151, 149, 438/294, 297, 163; 257/347, 349, 350

(56) References Cited

U.S. PATENT DOCUMENTS

| | | | |
|---|---|---|---|
| 5,128,274 A | | 7/1992 | Yabu et al. |
| 5,483,482 A | | 1/1996 | Yamada et al. |
| 5,729,039 A | | 3/1998 | Beyer et al. |
| 5,767,549 A | | 6/1998 | Chen et al. |
| 5,780,899 A | | 7/1998 | Hu et al. |
| 5,801,080 A | * | 9/1998 | Inoue et al. .............. 438/405 |
| 5,821,575 A | | 10/1998 | Mistry et al. |
| 5,926,698 A | * | 7/1999 | Ohkubo .................... 438/151 |
| 6,060,765 A | * | 5/2000 | Maeda ...................... 257/635 |
| 6,093,585 A | * | 7/2000 | Randazzo ................. 438/151 |

FOREIGN PATENT DOCUMENTS

| | | | |
|---|---|---|---|
| JP | 61-34978 | 2/1986 | |
| JP | 7-74363 | * 3/1995 | ......... H01L/29/786 |
| JP | 08-125187 | 5/1996 | |

OTHER PUBLICATIONS

W. Chen, Y. Taur, D. Sadana, K.A. Jenkins, J.Sun, and S. Cohen, "Suppression of the SOI Floating–body Effects by Linked–body Device Structure", Symposium on VLSI Technology Digest of Technical Papers, pp. 92–93, 1996.

Robert F. Pierret, Modular Series on Solid State Devices, vol. IV Field Effect Devices, 1983, Addison–Wesley Publishing Company, pp. 94–98.

* cited by examiner

Primary Examiner—Olik Chaudhuri
Assistant Examiner—David S Blum
(74) Attorney, Agent, or Firm—Hogan & Hartson, L.L.P.

(57) ABSTRACT

A semiconductor device comprises a semiconductor substrate having a first insulator, and a semiconductor channel region formed on the first insulator, wherein the semiconductor channel region comprising at least two first regions both having the first conductivity type, a second region of the conductivity type opposite to the first conductivity type, the second region being provided between the two first regions, a second insulator formed on the second region, a gate electrode formed on the second insulator, a third region having the same conductivity type as that of the second region, the third region being electrically conductive to the second region, a third insulator formed on the third region, the third insulator having a width narrower than the widths of an isolation region for isolating the semiconductor formation region, and a fourth region of the same conductivity type as that of the third region, the fourth region being electrically conductive to the third region.

4 Claims, 4 Drawing Sheets

METHOD OF MANUFACTURING SOI ELEMENT HAVING BODY CONTACT

CROSS-REFERENCE TO RELATED APPLICATIONS

The present application is a continuation of U.S. patent application Ser. No. 09/032,214, filed on Feb. 27, 1998, priority of which is hereby claimed under 35 U.S.C. §120. The present application also claims priority under 35 U.S.C. §119 and Rule 55 to Japanese patent Application No. 9-046688, filed on Feb. 28, 1997. All of these applications are expressly incorporated herein by reference as though fully set forth in full.

BACKGROUND OF THE INVENTION

The present invention relates to a semiconductor device and a method of manufacturing the same and, more particularly, a SOI (Silicon On Insulator) type semiconductor device and a method of manufacturing the same.

As the reduction in power consumption of semiconductor integrated circuits and the enhancement in mounting density thereof are furthered, the miniaturization of the individual elements constituting the integrated circuits and the lowering in operating voltages thereof are strongly desired. In the case of a conventional bulk planar type elements, as a result of the miniaturization of the elements and the reduction in channel length thereof, a short-channel effect is actualized; and, in order to prevent it, technical measures such as the enhancement of the impurity density in the substrate, the thinning of the gate insulator, etc. have been taken in accordance with several element size-reduction rules. However, as a matter of fact, as the elements are further and further miniaturized, the existence of some physical limits is encountered; and thus, in order to achieve a further miniaturization, some novel element structures have come to be proposed. As one such novel element structure, there can be pointed out a SOI element which has an insulator under an active region thereof.

Next, typical examples of the structure of an SOI element and the method of the manufacturing the same will be described below. First, FIG. 1 shows a sectional view taken along the direction of the channel length of the SOI element. On a monocrystalline silicon (Si) semiconductor substrate 1, a monocrystalline silicon (Si) active layer 3 is formed through, e.g. a silicon oxide layer ($SiO_2$) 2, and further, a gate electrode 9 is formed through, e.g. a silicon oxide layer ($SiO_2$) 8 which is to be used as a gate insulator. Further, a source region 4-1 and a drain region 4-2 are formed by introducing, by the use of ion implantation method, an impurity of the conductivity type opposite to that of a silicon active layer 4-3 which is to be used as a channel region.

However, the SOI element which has thus been formed is advantageous, in view of improving the element characteristics thereof, in that the film thickness of the active layer can be reduced, but on the other hand, due to the fact that the source and drain diffusion layers or the depletion layer extending from the source and drain diffusion layers reach even the insulator lying under the active layer, it is it is structurally difficult to control the potential in the body region so easily as in the case of a conventional bulk planar type element. As a result, there takes place the phenomenon that the potential in the body region floats during the operation of the element, thus posing problems such as the problem that, during the operation of the element, the threshold voltage of the element changes.

As countermeasures to these problems, attempts have been made to control the potential in the channel region of the thin-film SOI element.

For instance, in Japanese Patent Publication (KOKAI) No. 61-34978, it is proposed to form an electrode, between the isolation region and the buried insulator thereunder, for providing a potential to the channel region from outside. According to this method, however, the isolation insulator is formed in such a manner that the isolation region is previously oxidized into a thin film by selectively controlling the amount thereof, and further, the thicknesses of the contact portion to the channel region and the isolation region are controlled simultaneously and repeatedly again to form the isolation dielectric. Thus, the method has the problem or defect that it is very difficult to control the amount of the SOI layer at the respective manufacturing steps for the reduction in thickness of the SOI layer intended in view of improving the performances, and at the same time, the increase in the necessary area occupied by the element is increased.

As described above, mainly in the case of a conventional thin-film SOI element, there are problems or defects such as the defect that the manufacturing steps thereof become complicated as compared with the formation of a conventional bulk planar type element, and further, the area occupied by the element is substantially increased.

BRIEF SUMMARY OF THE INVENTION

It is the object of the present invention to provide, mainly, a SOI type semiconductor device and a method of manufacturing the semiconductor device, according to which the miniaturization of the semiconductor device, the enhancement in operating speed thereof, and the reduction in power consumption thereof can be realized.

To achieve the above subject, according to the present invention, the following means are employed.

The main point of the present invention lies in that, in the step of forming the isolation region, the isolation width thereof and the formation condition thereof are varied, whereby, in a desired area, a region in which an isolation layer formed from the surface of a channel layer does not extend as far as an insulator positioned under an active layer which lies under the isolation layer is formed in a self-aligning manner, and, through the region, a region for controlling the potential in a body region is formed.

The semiconductor device according to the present invention comprises a semiconductor substrate having a first insulator, and a semiconductor channel region formed on the first insulator, wherein the semiconductor channel region comprising at least two first regions both having the first conductivity type, a second region of the conductivity type opposite to the first conductivity type, the second region being provided between the two first regions, a second insulator formed on the second region, a gate electrode formed on the second insulator, a third region having the same conductivity type as that of the second region, the third region being electrically conductive to the second region, a third insulator formed on the third region, the third insulator having a width narrower than the widths of an isolation region for isolating the semiconductor formation region, and a fourth region of the same conductivity type as that of the third region, the fourth region being electrically conductive to the third region. In connection with this, it is preferable that the gate electrode is formed on the second region and the fourth region. Further, it is effective that the gate electrode is electrically conductive to the fourth region, and the gate electrode is formed on the fourth region through a fourth insulator.

The above-mentioned method of manufacturing a semiconductor device according to the present invention comprises the step of forming the third insulator simultaneously with the formation of the isolation region by making the interval between the second region and the fourth region narrower than the width of the isolation region at the time of forming the isolation region so as to extend as far as the first insulator in order to isolate the semiconductor channel region.

Further, the method of manufacturing a semiconductor device, which comprises a semiconductor substrate having a first insulator and a semiconductor channel region formed on the first insulator, the semiconductor channel region including at least two first regions of a first conductivity type, a second region provided between the first regions and having the conductivity type opposite to the first conductivity type, a second insulator formed on the second region, a gate electrode formed on the second insulator, a third region having the same conductivity type as that of the second region and being electrically conductive to the second region, a third insulator formed on the third region, and a fourth region having the same conductivity type as that of the third region and being electrically conductive to the third region, according to the present invention comprises the step of forming the third insulator simultaneously with the formation of the isolation region by narrowing the interval between the second region and the fourth region than the width of the isolation region at the time of forming the isolation region so as to extend as far as the first insulator in order to isolate the semiconductor channel region. In connection with this, it is preferable that the gate electrode is formed on the second region and the fourth region. Further, it is effective that the gate electrode is electrically conductive to the fourth region, and the gate electrode is formed on the fourth region through a fourth insulator.

By using the above-mentioned method, the electrode for controlling the potential in the body region can be formed without complicating the manufacturing steps as compared with the conventional bulk planar type element and by suppressing the increase of the area required. As a result, the problem pertaining to the floating effect of the body potential can be eliminated, and further, the body potentials of the individual elements can be arbitrarily controlled, so that a circuit operation etc. which could not be realized through the conventional bulk planar type elements can be achieved.

As mentioned above, according to the present invention, it is made possible, by controlling the width and film thickness of the isolation region, to form a thin-film SOI element in which the body potential can be controlled without increasing the number of manufacturing steps, complicating the structure of the element or increasing the area occupied by the element.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

Figure 1:
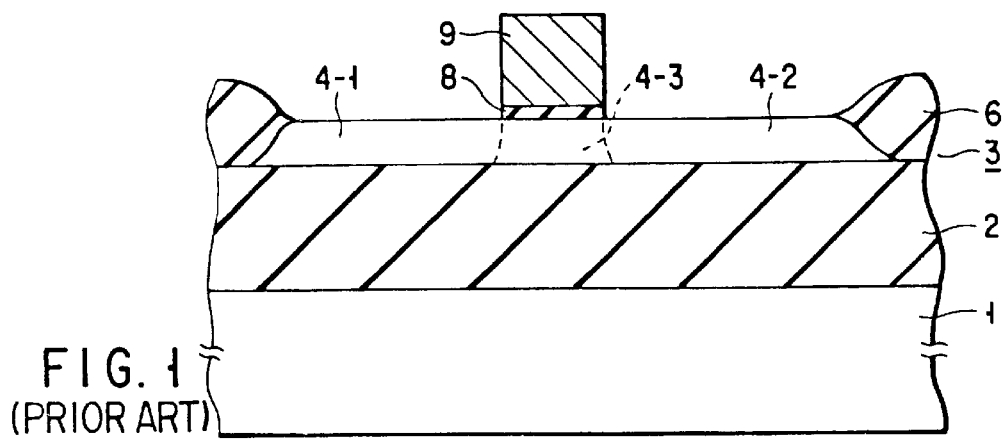
FIG. 1 is a sectional view showing a conventional semiconductor device.

The present invention will now be described referring to the drawings.

FIGS. 2 to 6 are schematic diagrams showing the manufacturing steps for explaining the first embodiment of the method of manufacturing a semiconductor device according to the present invention.

Figure 2:
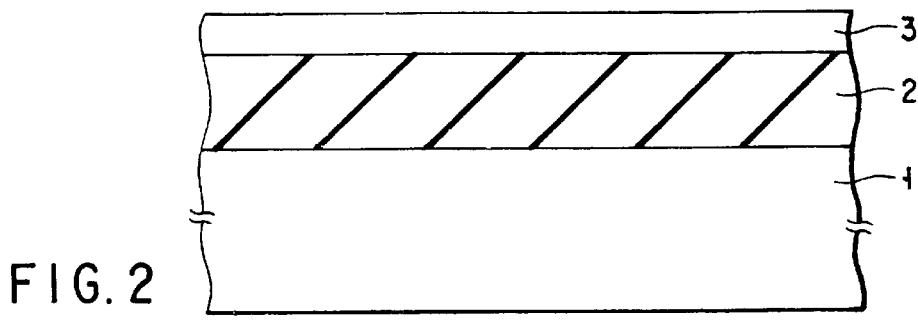
FIG. 2 is a sectional view of the semiconductor device, after the first manufacturing step, according to a first embodiment of the present invention.

First, as shown in FIG. 2, a SOI layer 3 formed through, e.g. an oxide layer 2 on a semiconductor substrate 1 by means of SIMOX or wafer bonding is thinned into a layer having a desired thickness of, e.g. about 150 nm by the use of the thermal oxidation method and an etching method using $NH_4F$.

Figure 3A:
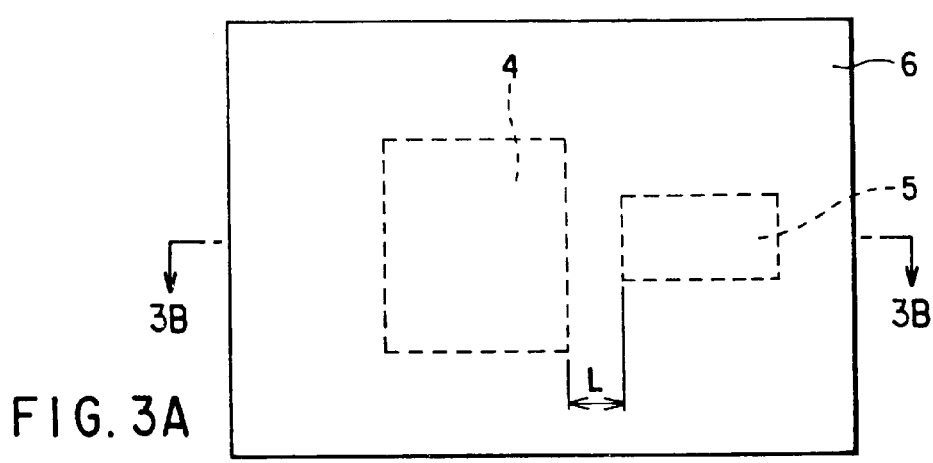
FIGS. 3A and 3B are respectively a plan view and a sectional view taken along the line 3B—3B in FIG. 3A of the semiconductor device after the second manufacturing step according to the first embodiment of the present invention.
Figure 3B:
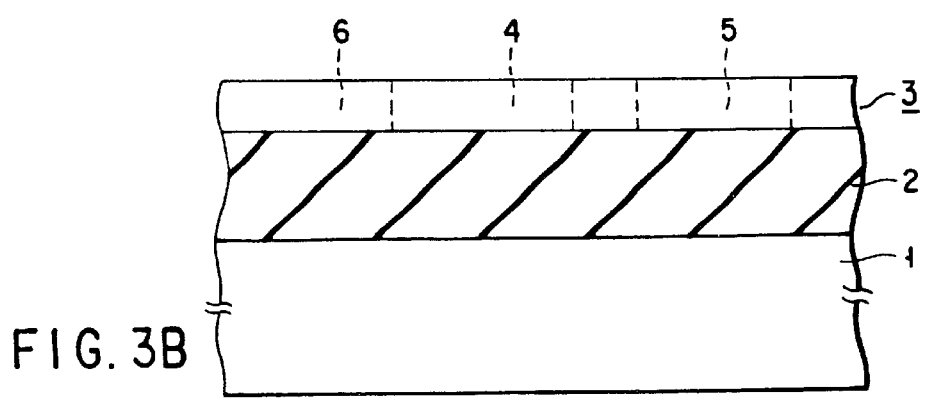

Next, as shown in FIGS. 3A and 3B, an isolation region 6 is formed in a desired area in order to separate the SOI layer 3 into an channel region 4 and a body contact region 5. In this case, the isolation width L between the channel region 4 and the body contact region 5 is arranged so as to become narrower than the other isolation widths. By selecting this isolation width L so as to be narrower than the other isolation widths, it is ensured that, even in case the isolation region is formed at the same time as according to the present invention, the portion of the isolation region lying between the channel region 4 and the body contact region 5 is not oxidized as far as the oxide layer 2 unlike in the case of the other portions of the isolation region. The isolation width L is determined by means of, e.g. simulation. The isolation region is formed by the use of, e.g. the LOCOS method, in which case the insulator, which is rendered into the isolation region is formed by oxidizing mainly the SOI layer. In this case, the amount of oxidation of the SOI layer is controlled, whereby, in the wider portion of the isolation region, the whole SOI layer is oxidized.

Figure 4:
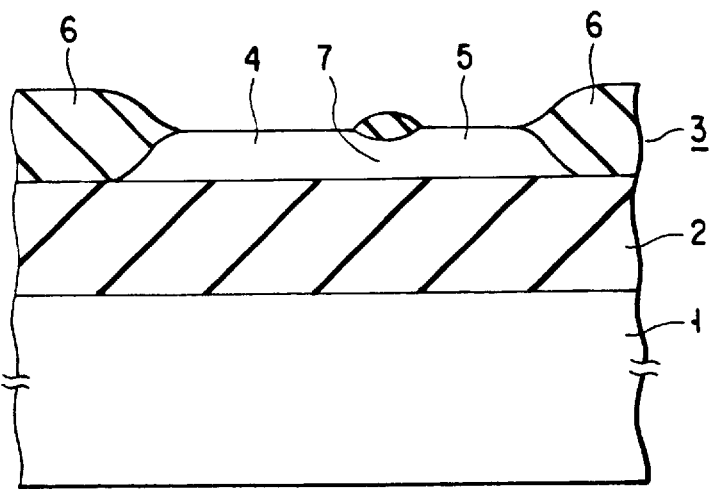
FIG. 4 is a sectional view of the semiconductor device after the third manufacturing step according to the first embodiment of the present invention.

Here, it should be noted that, in the case of the portion of the isolation region which lies between the channel region 4 and the body contact reason 5 and has the isolation width L narrower than the widths of the other portions of the isolation region, it never happens that the whole SOI region is oxidized as far as the oxide layer 2, so that, as shown in FIG. 4, a region 7 connecting the channel region 4 and the body contact region 5 to each other can be formed beneath the element isolation insulating film.

Figure 5A:
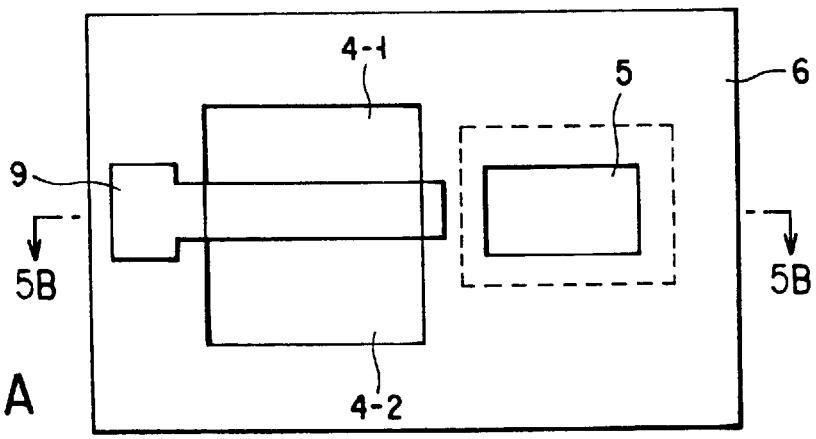
FIGS. 5A and 5B are respectively a plan view and a sectional view taken along the line 5B—5B in FIG. 5A, of the semiconductor device after the fourth manufacturing step of the first embodiment of the present invention.
Figure 5B:
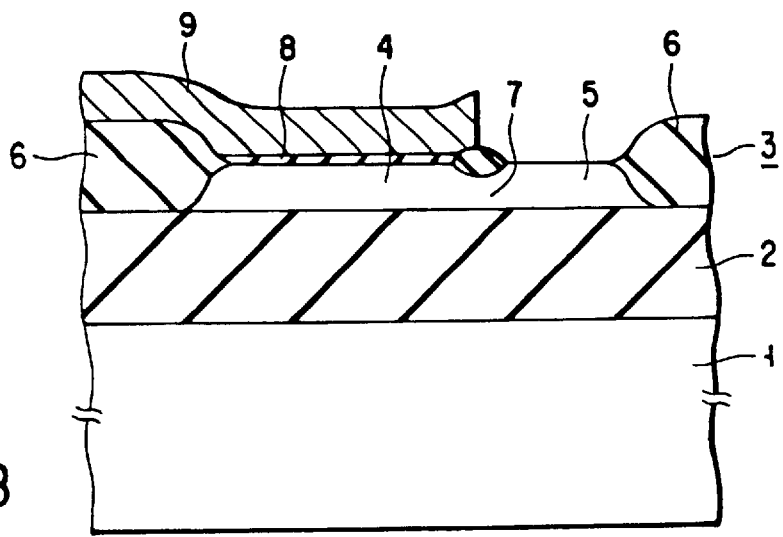

Next, desired impurities are injected into the channel region 4, the body contact region 5 and the region 7 which connects them together by the use of the ion implantation method, and thereafter, as shown in FIGS. 5A and 5B, a gate electrode 9 is formed through a gate insulator 8 on the isolation region 6 and the SOI layer 3 excepting the body contact region 5.

Next, the body contact region 5 is masked by the use of, e.g. a resist (not shown), a desired impurity is introduced for the formation of the source and drain regions 4-1 and 4-2 of the element. After this, an annealing treatment is carried out using a thermal step such as, e.g. the RTA (Rapid Thermal Annealing) method for activation of the impurity introduced by the use of the ion implantation method.

Figure 6:
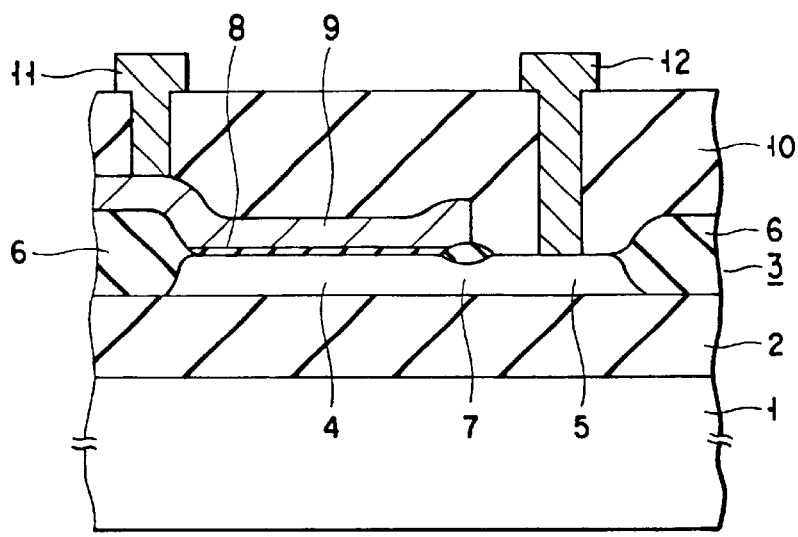
FIG. 6 is a sectional view of the semiconductor device according to the first embodiment of the present invention.

Thereafter, the step of forming a wiring for providing contacts 11 and 12 (the source contact and the drain contact being not shown) respectively to the source and drain regions 4-1 and 4-2, the gate electrode 9, and the body contact region 5 through an interlevel dielectric 10 is performed, whereby a desired SOI type semiconductor device shown in FIG. 6 is completed.

In the case of the thin-film SOI element formed in accordance with the first embodiment of the present invention, the abnormal operation due to float the potential in the body region can be suppressed by controlling the body potential in spite of the fact that the method of manufacturing the SOI element is approximately the same as the conventional method.

Further, in the case of the element according to the present invention, when the element operates, the channel inversion layer through which the current flowing between the source and drain passes and the body potential contact region can be isolated from each other by the isolation region, so that, between the source, the drain and the channel inversion layer and the body potential control contact, no high-density pn-junction is formed, so that the leakage current from the body contact region can be structurally reduced.

Figure 7:
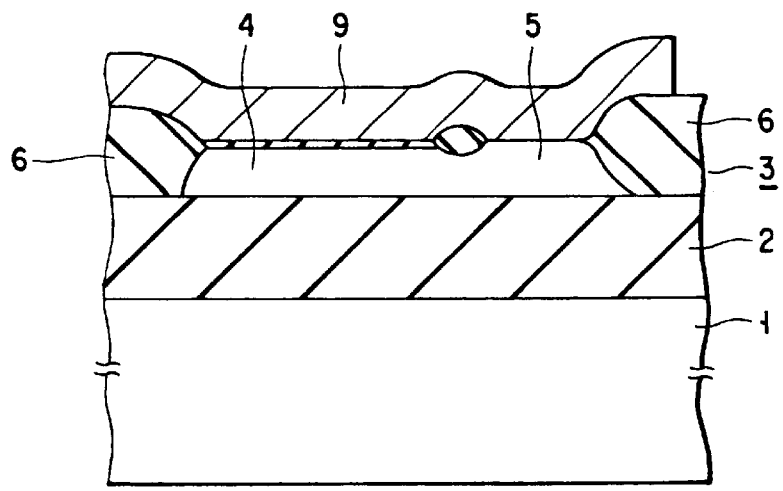
FIG. 7 is a sectional view of the semiconductor device according to a second embodiment of the present invention.

FIG. 7 is a schematic diagram showing a second embodiment of the semiconductor device according to the present invention, wherein the same portions as those shown in the drawings pertaining to the first embodiment shown are denoted by the same reference numerals, whereby the repetition of the description thereof is omitted.

The above-described first embodiment is of the structure constructed in such a manner that the channel potential is given from outside, but even if the thin-film SOI element is formed, for instance, in such a manner that, after the element isolation 6 is formed and then, on the channel region 4 and the body contact region 5, the gate insulator (not shown) is formed, and thereafter, the insulator on the body contact region 5 is selectively removed to form the gate electrode as shown in FIG. 7, it is also possible to control the potential of the body contact region 5 like the gate potential.

Figure 8:
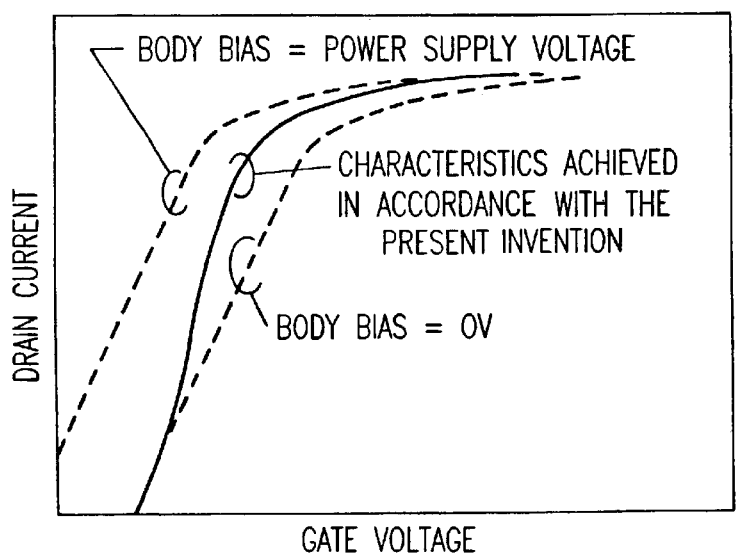
FIG. 8 is a graph showing the characteristic of the semiconductor device according to the second embodiment of the present invention.

In case the above-mentioned structure is employed, a very good cut-off characteristic is exhibited as shown in FIG. 8 due to the substrate bias effect of the element in case, particularly, the operating voltage range is below the built-in potential induced at the pn-junction between the source and drain diffusion layer and the body region. Thus, according to the second embodiment of the present invention, a semiconductor device having a very good cut-off characteristic can be realized without being followed by an increase of unnecessary leakage current and without increasing the manufacturing steps and the area occupied by the element.

Figure 9A:
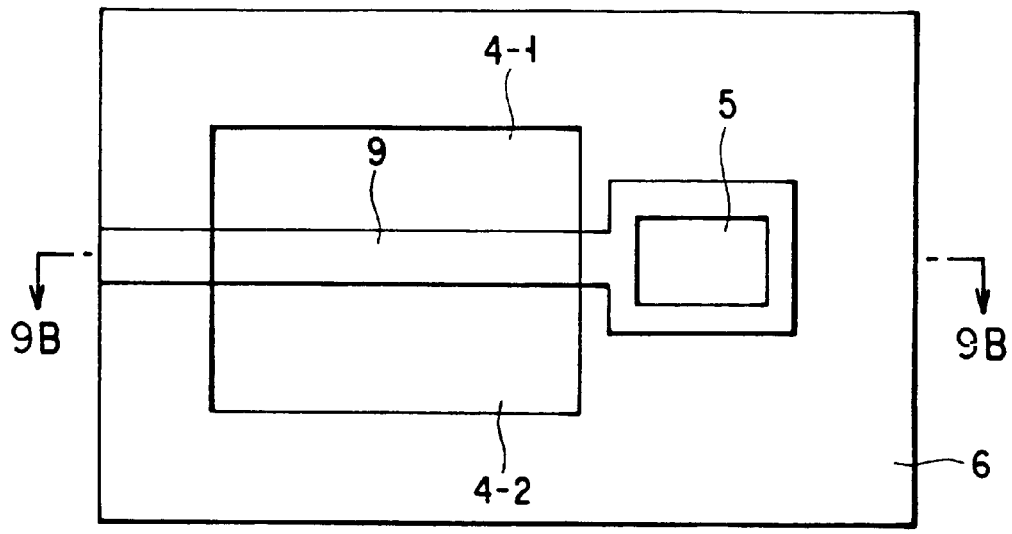
FIGS. 9A and 9B are respectively a plan view and a sectional view taken along the line 9B—9B in FIG. 9A, of the semiconductor device according to a third embodiment of the present invention.
Figure 9B:
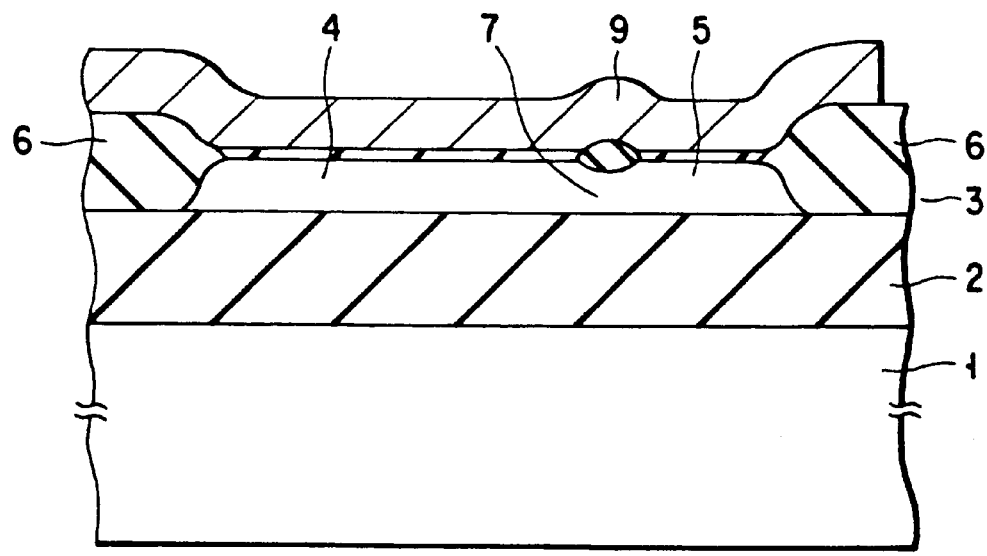

FIGS. 9A and 9B are schematic diagrams showing a third embodiment of the semiconductor device according to the present invention. In these drawings, the same portions as those shown in the drawings pertaining to the first embodiment are denoted by the same reference numerals, whereby the repetition of the description thereof is omitted.

The semiconductor device shown in FIGS. 9A and 9B is constructed in such a manner that, with the formation, between the contact region for controlling the body potential and the gate electrode 9 formed of for instance a polycrystalline semiconductor, of an insulator similar to that of the channel region, the portion of the gate electrode 9 lying on the body contact region 5 is rendered into the conductivity type same as that of the body contact region. Portion of the gate electrode 9 lying on the channel region 4, and further, a material such as for instance tungsten polycide or the like is provided in such a manner as to extend over the portions of the polycrystalline semiconductor gate electrode 9 lying on the body contact region 5 and the channel region 4, respectively, to thereby make the portions electrically conductive to each other. By adopting such a structure, it is ensured that, in case the gate voltage is transiently applied in operating the semiconductor device, the body potential can be changed, as in the case of the second embodiment, by the capacitive coupling formed in the body contact region 5. In particular, this third embodiment has the advantage that, in the circuit operating at high frequency, preventing the leakage current from the electrode which provides a body potential, the body bias effect due to capacitive coupling can be effectively utilized.

The present invention is not limited only to the foregoing embodiments. According to the present invention, for instance as the monocrystalline layer formed on the insulator, not only the SOI substrate formed by the use of the above-mentioned SIMOX method or the wafer bonding method, but also a monocrystalline layer stuck on an insulation substrate and an SOS (Silicon On Sapphire) can be used.

It is a matter of course that the present invention can be variously modified within the technical scope of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, which comprises: a semiconductor substrate having a first insulator and a semiconductor layer formed on said first insulator, said semiconductor layer including a plurality of active regions each including at least two source-drain regions of a first conductivity type, a channel region provided between said source-drain regions and having a second conductivity type opposite to said first conductivity type, a gate insulator formed on said channel region, a gate electrode formed on said gate insulator, a channel-body contact connection region having the same conductivity type as that of said channel region and being electrically conductive to said channel region, a second insulator formed on said channel-body contact connection region, and a body contact region having the same conductivity type as that of said channel-body contact connection region and being electrically conductive to said channel-body contact connection region, and an isolation region which electrically isolates said plurality of active regions, said method comprising the step of:

forming said second insulator simultaneously with the formation of an isolation region without varying thickness of said semiconductor layer, whereby a distance between said channel region and said body contact region is narrower than the width of said isolation region at the time of forming said isolation region, said isolation region formed so as to extend as far as said first insulator in order to isolate said semiconductor layer.

2. A method of manufacturing the semiconductor device according to claim 1, wherein said gate electrode is formed on said channel region and said body contact region.

3. A method of manufacturing the semiconductor device according to claim 2, wherein said gate electrode is electrically conductive to said body contact region.

4. A method of manufacturing the semiconductor device according to claim 2, wherein said gate electrode is formed on said body contact region through a body contact insulator.

* * * * *